(12) United States Patent
Lin et al.

(10) Patent No.: US 9,293,366 B2
(45) Date of Patent: Mar. 22, 2016

(54) THROUGH-SUBSTRATE VIAS WITH IMPROVED CONNECTIONS

(75) Inventors: Jing-Cheng Lin, Hsin-Chu (TW); Ku-Feng Yang, Dali (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 451 days.

(21) Appl. No.: 12/769,251

(22) Filed: Apr. 28, 2010

(65) Prior Publication Data

US 2011/0266691 A1  Nov. 3, 2011

(51) Int. Cl.
*H01L 29/40* (2006.01)
*H01L 21/768* (2006.01)
*H01L 23/498* (2006.01)
*H01L 23/00* (2006.01)

(52) U.S. Cl.
CPC .... *H01L 21/76898* (2013.01); *H01L 21/76816* (2013.01); *H01L 23/49827* (2013.01); *H01L 24/05* (2013.01); *H01L 24/13* (2013.01); *H01L 24/14* (2013.01); *H01L 2224/0401* (2013.01); *H01L 2224/05572* (2013.01); *H01L 2224/13025* (2013.01); *H01L 2224/13144* (2013.01); *H01L 2224/13147* (2013.01); *H01L 2224/13155* (2013.01); *H01L 2224/14181* (2013.01); *H01L 2224/73204* (2013.01); *H01L 2924/0002* (2013.01); *H01L 2924/01019* (2013.01); *H01L 2924/10253* (2013.01); *H01L 2924/10271* (2013.01); *H01L 2924/10329* (2013.01); *H01L 2924/14* (2013.01)

(58) Field of Classification Search
CPC ............ H01L 21/76898; H01L 23/481; H01L 21/7682; H01L 21/76829; H01L 21/76879

USPC .......... 257/508, 621–774; 438/455, 637, 109; 326/80

See application file for complete search history.

(56) References Cited

U.S. PATENT DOCUMENTS

| | | | |
|---|---|---|---|
| 5,391,917 A | 2/1995 | Gilmour et al. | |
| 5,510,298 A | 4/1996 | Redwine | |
| 5,767,001 A * | 6/1998 | Bertagnolli et al. | ......... 438/455 |
| 5,998,292 A | 12/1999 | Black et al. | |
| 6,184,060 B1 | 2/2001 | Siniaguine | |
| 6,322,903 B1 | 11/2001 | Siniaguine et al. | |
| 6,448,168 B1 | 9/2002 | Rao et al. | |
| 6,465,892 B1 | 10/2002 | Suga | |
| 6,472,293 B1 | 10/2002 | Suga | |
| 6,538,333 B2 | 3/2003 | Kong | |
| 6,599,778 B2 | 7/2003 | Pogge et al. | |
| 6,639,303 B2 | 10/2003 | Siniaguine | |
| 6,664,129 B2 | 12/2003 | Siniaguine | |
| 6,693,361 B1 | 2/2004 | Siniaguine et al. | |
| 6,740,582 B2 | 5/2004 | Siniaguine | |
| 6,800,930 B2 | 10/2004 | Jackson et al. | |

(Continued)

*Primary Examiner* — Jerome Jackson, Jr.
*Assistant Examiner* — Fang-Xing Jiang
(74) *Attorney, Agent, or Firm* — Slater & Matsil, L.L.P.

(57) ABSTRACT

A device includes a substrate, and a plurality of dielectric layers over the substrate. A plurality of metallization layers is formed in the plurality of dielectric layers, wherein at least one of the plurality of metallization layers comprises a metal pad. A through-substrate via (TSV) extends from the top level of the plurality of the dielectric layers to a bottom surface of the substrate. A deep conductive via extends from the top level of the plurality of dielectric layers to land on the metal pad. A metal line is formed over the top level of the plurality of dielectric layers and interconnecting the TSV and the deep conductive via.

18 Claims, 11 Drawing Sheets

(56) References Cited

U.S. PATENT DOCUMENTS

| | | | | |
|---|---|---|---|---|
| 6,841,883 | B1 | 1/2005 | Farnworth et al. | |
| 6,882,030 | B2 | 4/2005 | Siniaguine | |
| 6,924,551 | B2 | 8/2005 | Rumer et al. | |
| 6,962,867 | B2 | 11/2005 | Jackson et al. | |
| 6,962,872 | B2 | 11/2005 | Chudzik et al. | |
| 6,984,892 | B2 * | 1/2006 | Gotkis | H01L 21/7682 257/522 |
| 7,030,481 | B2 | 4/2006 | Chudzik et al. | |
| 7,049,170 | B2 | 5/2006 | Savastiouk et al. | |
| 7,060,601 | B2 | 6/2006 | Savastiouk et al. | |
| 7,071,546 | B2 | 7/2006 | Fey et al. | |
| 7,111,149 | B2 | 9/2006 | Eilert | |
| 7,122,912 | B2 | 10/2006 | Matsui | |
| 7,157,787 | B2 | 1/2007 | Kim et al. | |
| 7,193,308 | B2 | 3/2007 | Matsui | |
| 7,262,495 | B2 | 8/2007 | Chen et al. | |
| 7,297,574 | B2 | 11/2007 | Thomas et al. | |
| 7,335,972 | B2 | 2/2008 | Chanchani | |
| 7,354,798 | B2 * | 4/2008 | Pogge et al. | 438/109 |
| 7,355,273 | B2 | 4/2008 | Jackson et al. | |
| 7,608,538 | B2 * | 10/2009 | Deligianni | H01L 21/76879 204/194 |
| 2002/0081838 | A1 * | 6/2002 | Bohr | 438/637 |
| 2004/0101663 | A1 * | 5/2004 | Agarwala | H01L 21/76829 428/209 |
| 2007/0090490 | A1 * | 4/2007 | Chang et al. | 257/621 |
| 2008/0079461 | A1 * | 4/2008 | Lin et al. | 326/80 |
| 2008/0283959 | A1 * | 11/2008 | Chen et al. | 257/508 |
| 2008/0303154 | A1 | 12/2008 | Huang et al. | |
| 2009/0014888 | A1 * | 1/2009 | Lee et al. | 257/774 |
| 2009/0102021 | A1 * | 4/2009 | Chen et al. | 257/621 |
| 2009/0160058 | A1 * | 6/2009 | Kuo et al. | 257/758 |
| 2009/0315154 | A1 * | 12/2009 | Kirby et al. | 257/621 |
| 2010/0187671 | A1 * | 7/2010 | Lin et al. | 257/686 |

\* cited by examiner

THROUGH-SUBSTRATE VIAS WITH IMPROVED CONNECTIONS

TECHNICAL FIELD

This disclosure relates generally to integrated circuit structures, and more particularly to forming through-substrate vias with improved electrical connections.

BACKGROUND

Among the efforts for reducing the size of integrated circuits and reducing RC delay, three-dimensional integrated circuit (3DIC) and stacked dies are commonly used. Through-substrate vias (TSVs) are thus used in 3DIC and stacked dies. In this case, TSVs are often used to connect the integrated circuits on a die to the backside of the die. In addition, TSVs are also used to provide short grounding paths for grounding the integrated circuits through the backside of the die, which may be covered by a grounded metallic film.

There are two commonly used approaches for forming TSVs, via-first approach and via-last approach. When formed using the via-first approach, vias are formed before the back-end-of-line (BEOL) processes are performed. Accordingly, the TSVs are formed before the formation of metallization layers. Due to the thermal budget in the BEOL processes, however, the TSVs formed using the via-first approach suffer from problems such as copper popping and metal-1 to metal-2 bridging.

On the other hand, the via-last approach, although being cost effective and having a short time-to-market, the resulting structures are less efficient in power connection. For example, FIGS. 1 and 2 illustrate two interconnect structures comprising via-last TSVs. In FIG. 1, die 4 is bonded to die 2 through a face-to-face bonding. In FIG. 2, die 4 is bonded to die 2 through a face-to-back bonding. TSVs 6 are formed in dies 2, and are used for connecting power to the devices in dies 2. It is observed that regardless whether the power is introduced into die 2 from bump 12 as in FIG. 1, or introduced into die 2 from die 4 as in FIG. 2, the connection of the power to device 8 in dies 4 have long paths, as illustrated by arrows 14. Further, each of the long power paths 14 includes a plurality of metal lines and vias. Accordingly, the resistances of the power paths are also high.

SUMMARY

In accordance with one aspect, a device includes a substrate, and an interconnect structure over the substrate. The interconnect structure includes a plurality of metallization layers including a bottom metallization layer (M1) and a top metallization layer (Mtop). A dielectric layer is over the Mtop. A through-substrate via (TSV) is formed to extend from a top surface of the dielectric layer to a bottom surface of the substrate. A deep conductive via is formed to extend from the top surface of the dielectric layer to land on a metal pad in one of the plurality of metallization layers. A metal line is over the dielectric layer and interconnects the TSV and the deep conductive via.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel method for forming through-silicon vias (TSVs, also sometimes known as through-silicon vias when they are formed in a silicon substrate) is provided. The intermediate stages of manufacturing an embodiment are illustrated. The variations of the embodiment are then discussed. Throughout the various views and illustrative embodiments, like reference numbers are used to designate like elements.

Figure 1:
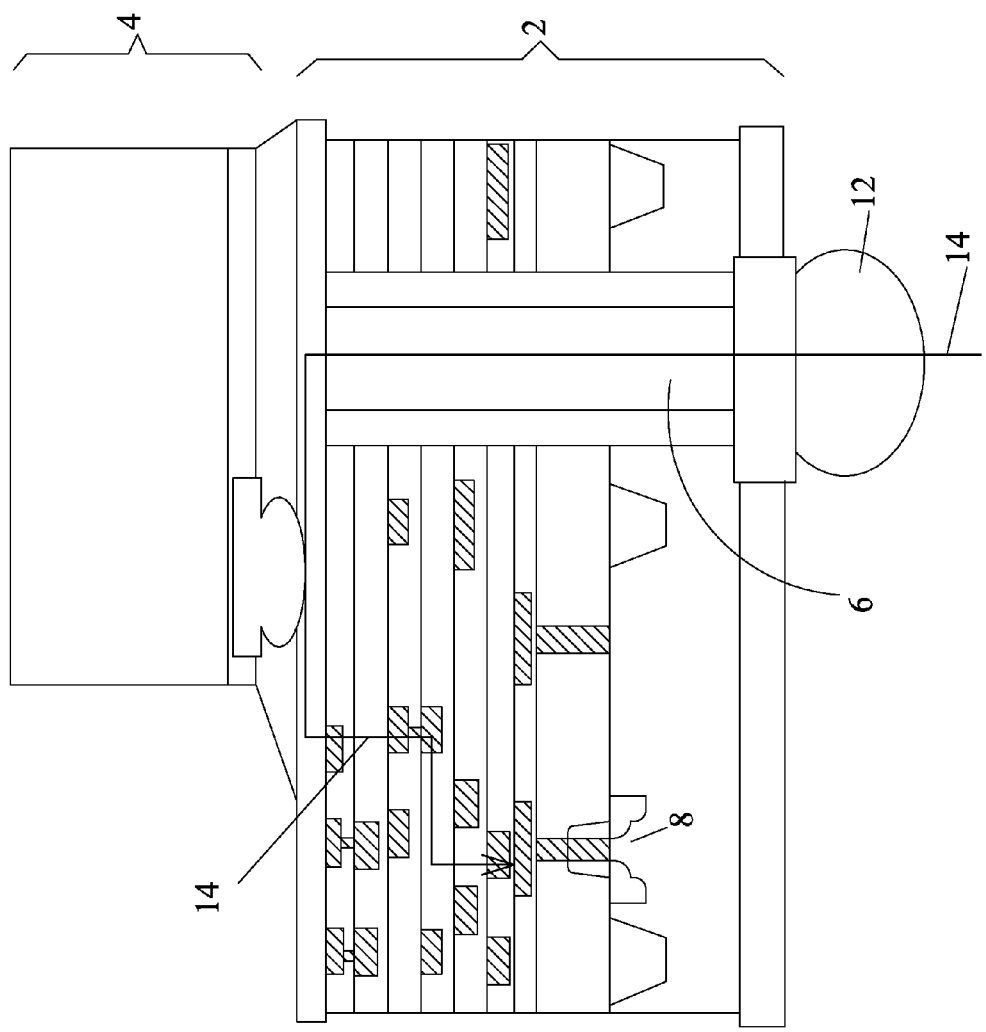
FIGS. 1 and 2 illustrate conventional connections of power into dies through through-substrate vias (TSVs)
Figure 2:
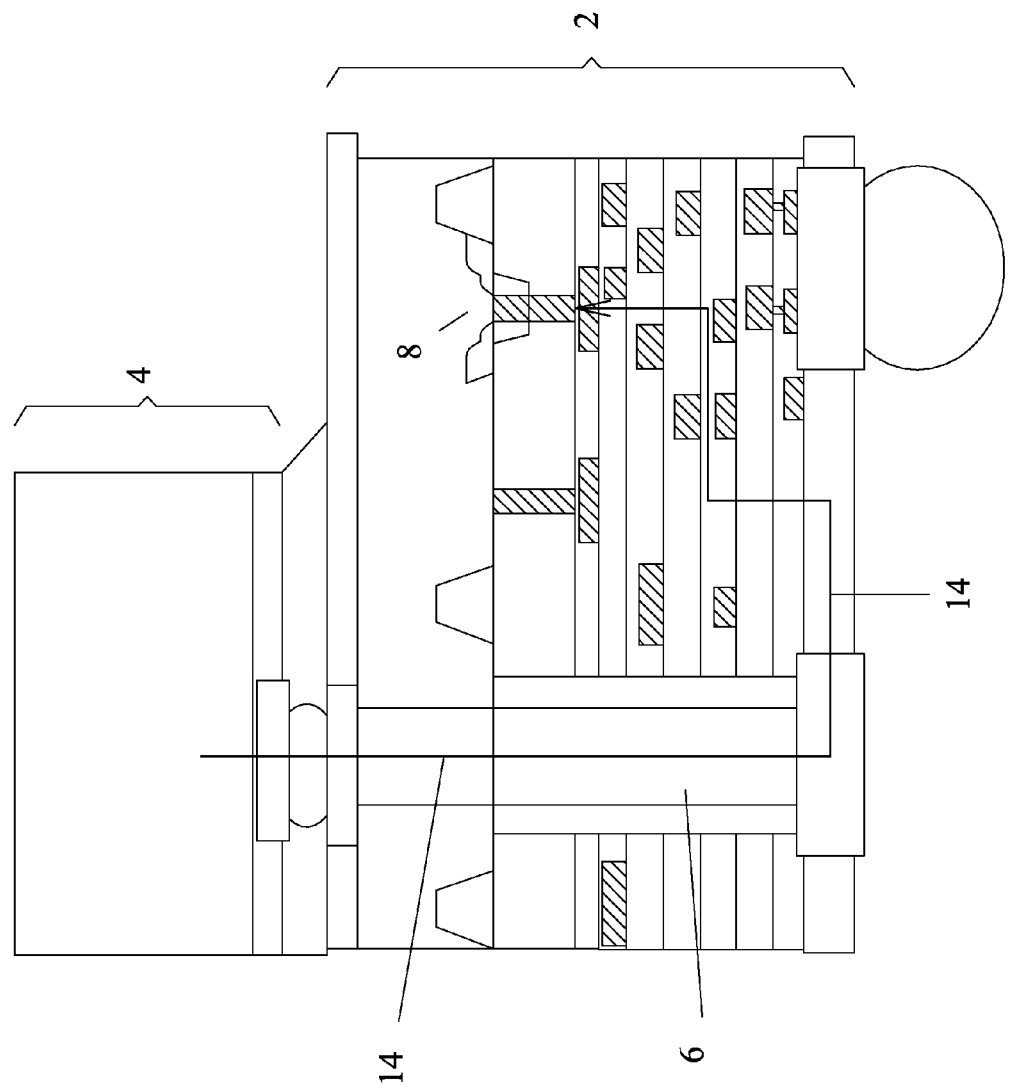
Figure 3:
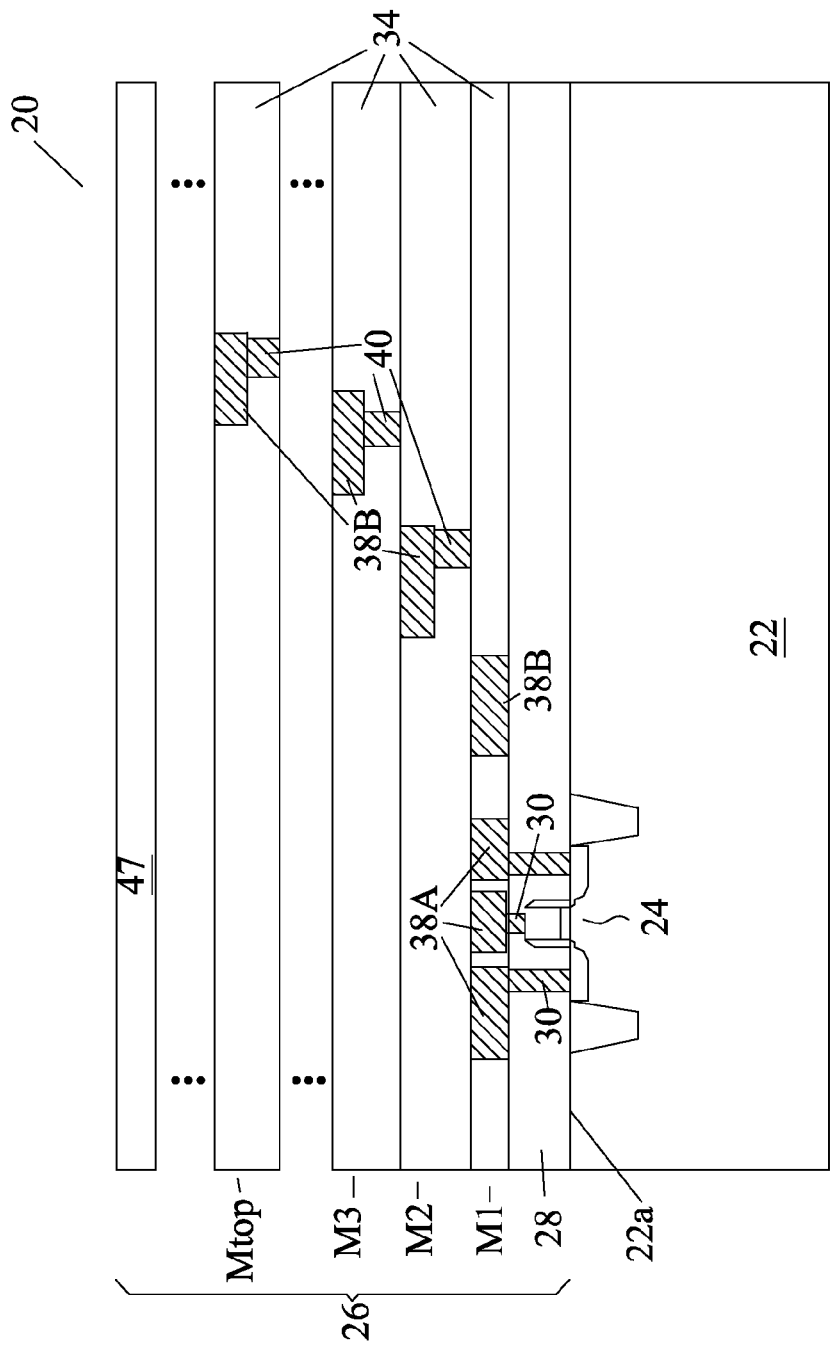
FIGS. 3 through 9 are cross-sectional views of intermediate stages in the manufacturing of a wafer comprising a TSV and deep conductive vias connected to the TSV in accordance with various embodiments.

Referring to FIG. 3, wafer 20, which includes substrate 22 and integrated circuits 24 (symbolized by a transistor) therein, is provided. In accordance with various embodiments, wafer 20 is a device wafer comprising active integrated circuit devices such as transistors. Substrate 22 may be a semiconductor substrate, such as a bulk silicon substrate, although it may be formed of other semiconductor materials such as silicon germanium, gallium arsenide, and/or the like. Semiconductor devices such as transistors (a symbolized by transistor 24) may be formed at the front surface 22a of substrate 22. Interconnect structure 26 is formed on the front side of substrate 22. Interconnect structure 26 may include inter-layer dielectric (ILD) 28 (in which the electrodes of transistor is located) and contact plugs 30 in ILD 28, wherein contact plugs 30 may be formed of tungsten or other metallic materials.

Furthermore, interconnect structure 26 include inter-metal dielectrics (IMDs) 34, and metal lines/pads 38 (including 38A and 38B) and vias 40 in IMDs 34. IMDs 34 may be formed of low-k dielectric materials having low k values, for example, lower than about 2.5, or even lower than about 2.0. Interconnect structure 26 may include a bottom metallization layer (commonly known as M1) and a top metallization layer (commonly known as Mtop), and a plurality of metallization layers therebetween, including the metallization layer (M2) immediately over M1, the metallization layer (M3) immediately over M2, and the like. The metal features in interconnect structure 26 may be electrically coupled to semiconductor devices 24. Metal lines/pad 38 and vias 40 may be formed of copper or copper alloys, and may be formed using the well-known damascene processes. Metal lines/pads 38 include metal lines 38A and metal pads 38B, with metal pads 38B being used for landing the subsequently formed deep vias.

Interconnect structure 26 may further include one or more passivation layer(s) 47 that is immediately over metallization layer Mtop. Passivation layer 47 may be a non-low-k dielectric layer, and may be formed of silicon oxide, silicon nitride, un-doped silicate glass, polyimide, or the like. Further, additional metal lines/pads and vias (not shown) may be formed in passivation layer(s) 47.

Figure 11:
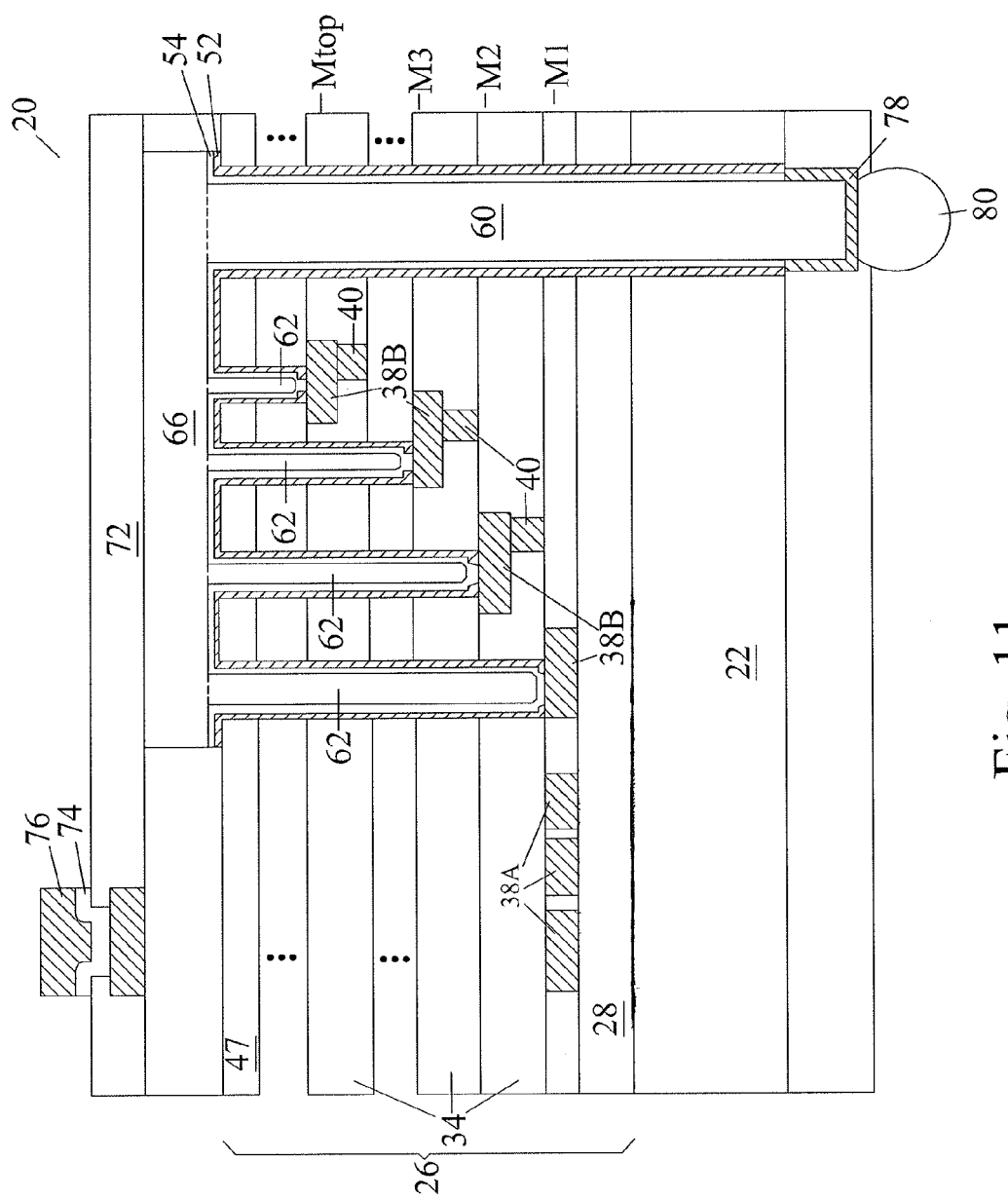
FIG. 11 illustrates a wafer comprising a TSV and deep conductive vias, wherein the TSV extends through a substrate that is substantially free from an integrated circuit device.

In alternative embodiments, such as in the example of FIG. 11, wafer 20 is an interposer wafer, and is substantially free from integrated circuit devices, including active devices such as transistors and diodes formed therein. In these embodiments, substrate 22 may be formed of a semiconductor material or a dielectric material. The dielectric material may be silicon oxide, an organic material such as polyimide, a hybrid material such as molding compound, glass, or the like. Furthermore, interposer wafer 20 may include, or may be free from, passive devices such as capacitors, resistors, inductors, varactors, and/or the like.

Figure 4:
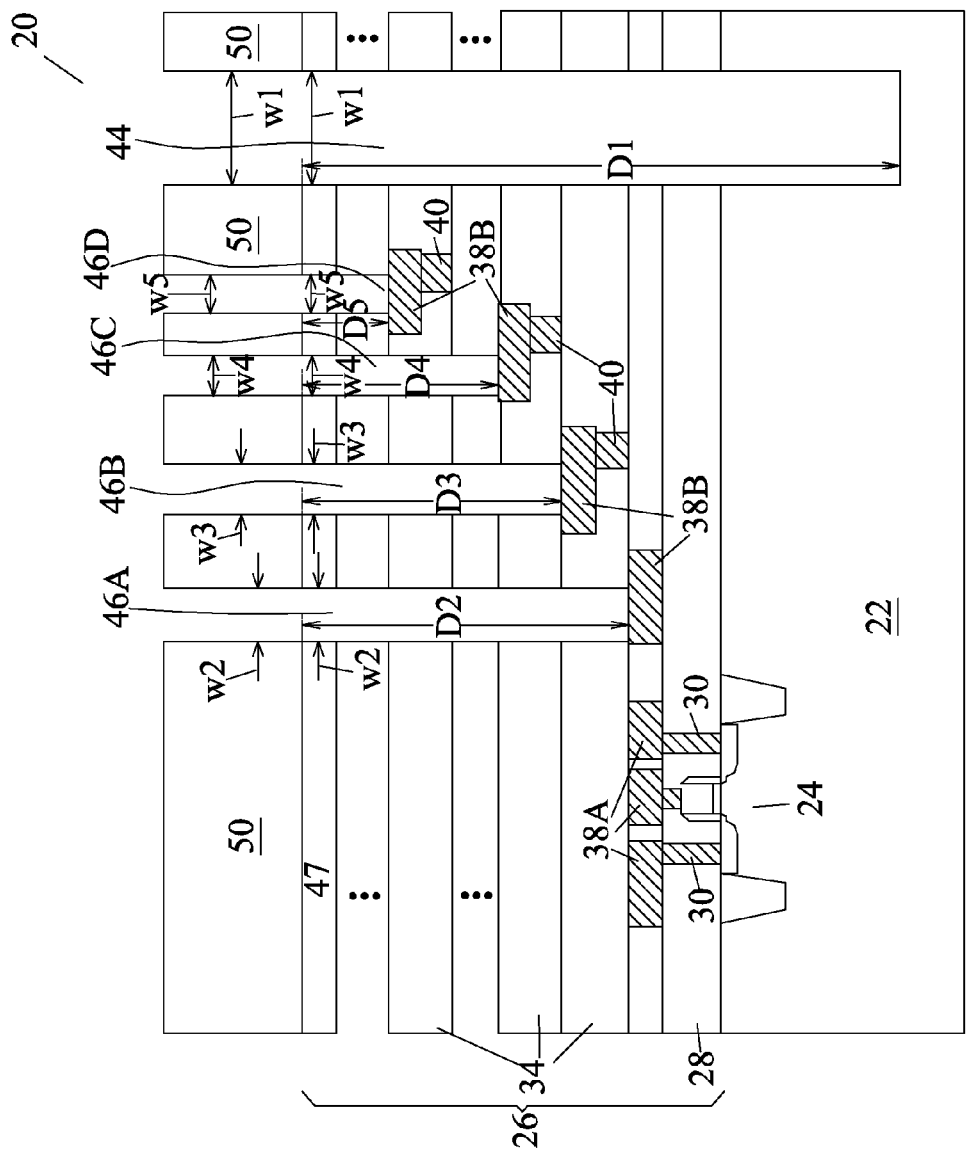

Referring to FIG. 4, after the formation of interconnect structure 26, which may or may not include layer(s) 47, TSV opening 44 and deep via openings 46 (including 46A, 46B, 46C, 46D, and possibly more that are not illustrated) are formed. In an embodiment, photo resist 50 is formed and patterned. TSV opening 44 and deep via openings 46 are then formed simultaneously by etching. TSV opening 44 extends into substrate 22, while deep via openings 46 stop at respective metal pads 38B, with metal pads 38B exposed through deep vias 46. Further, the formation of deep via openings 46 may stop at metal pads 38B in any one of different metallization layers ranging from M1 through Mtop in any desirable combination.

In an embodiment, pattern loading effect is used to form TSV opening 44 and deep vias openings 46, which have different depths, simultaneously. It is observed that when certain via openings are formed, the via openings having greater horizontal sizes may have greater depths than the via openings having smaller sizes, even if they are formed by a same etching process. As a result of the pattern loading effect in the etching process, and also due to the size difference between TSV opening 44 and deep via openings 46, the resulting TSV opening 44 and deep via openings 46 will have different depths. With properly adjusted horizontal sizes W1 through W5, when the desirable depth D1 of TSV opening 44 is reached, desirable depths D2, D3, D4, D5, and the like are also reached. This may reduce the undesirable over-etching of metal pads 38B, and hence the undesirable damage to metal pads 38B may be minimized. Accordingly, the horizontal dimension W1 (which may be a diameter or a length/width, depending on the shape of TSV opening 44) of TSV opening 44 is greater than horizontal dimensions W2, W3, W4, and W5 of deep via openings 46. In an embodiment, a ratio of W1/W2 (or W1/W3, W1/W4, and so on) may be greater than about 1.5, greater than about 5, or even greater than about 100. Further, depth D1 of TSV opening 44 is greater than depth D2 of deep via openings 46. In an embodiment, a ratio of D1/D2 (or D1/D3, D1/D4, and so on) may be greater than about 5, or even greater than about 5,000. Further, in the illustrated embodiments, W2 may be greater than W3 with ratio W2/W3 being greater than about 1.2, W3 may be greater than W4 with ratio W3/W4 being greater than about 1.2, and W4 may be greater than W5 with ratio W4/W5 being greater than about 1.2.

Figure 5:
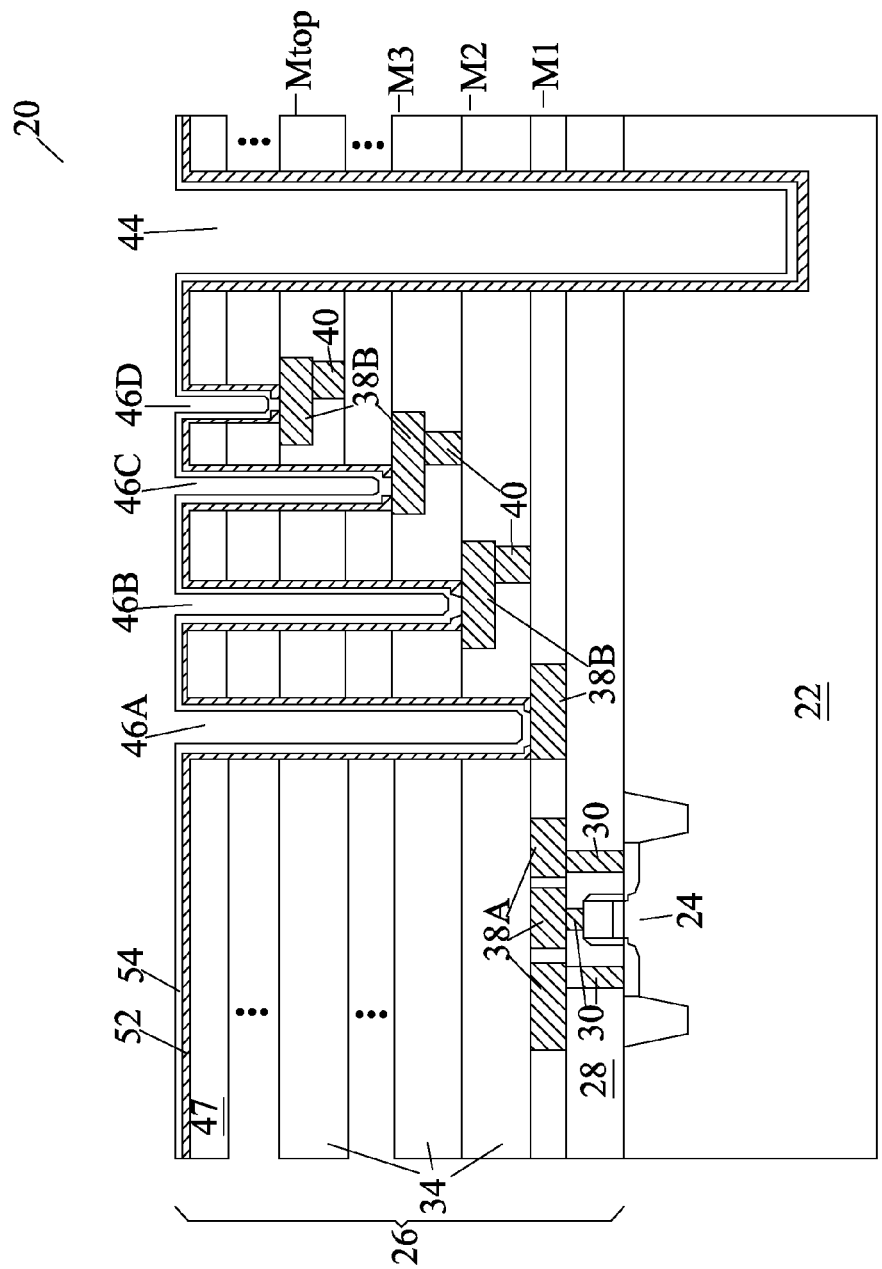

Referring to FIG. 5, insulation layer 52 is formed and patterned, and metal pads 38B are exposed through the openings in insulation layer 52. Next, diffusion barrier layer 54, also referred to as a glue layer, is blanket formed, covering the sidewalls and the bottom of TSV opening 44. Diffusion barrier layer 54 may include commonly used barrier materials such as titanium, titanium nitride, tantalum, tantalum nitride, and combinations thereof, and can be formed using physical vapor deposition, for example. Next, a thin seed layer (not shown) may be blanket formed on diffusion barrier layer 54. The materials of the seed layer may include copper or copper alloys, and metals such as silver, gold, aluminum, and combinations thereof may also be included. In an embodiment, the seed layer is formed of sputtering. In other embodiments, other commonly used methods such as electro or electroless plating may be used.

Figure 6:
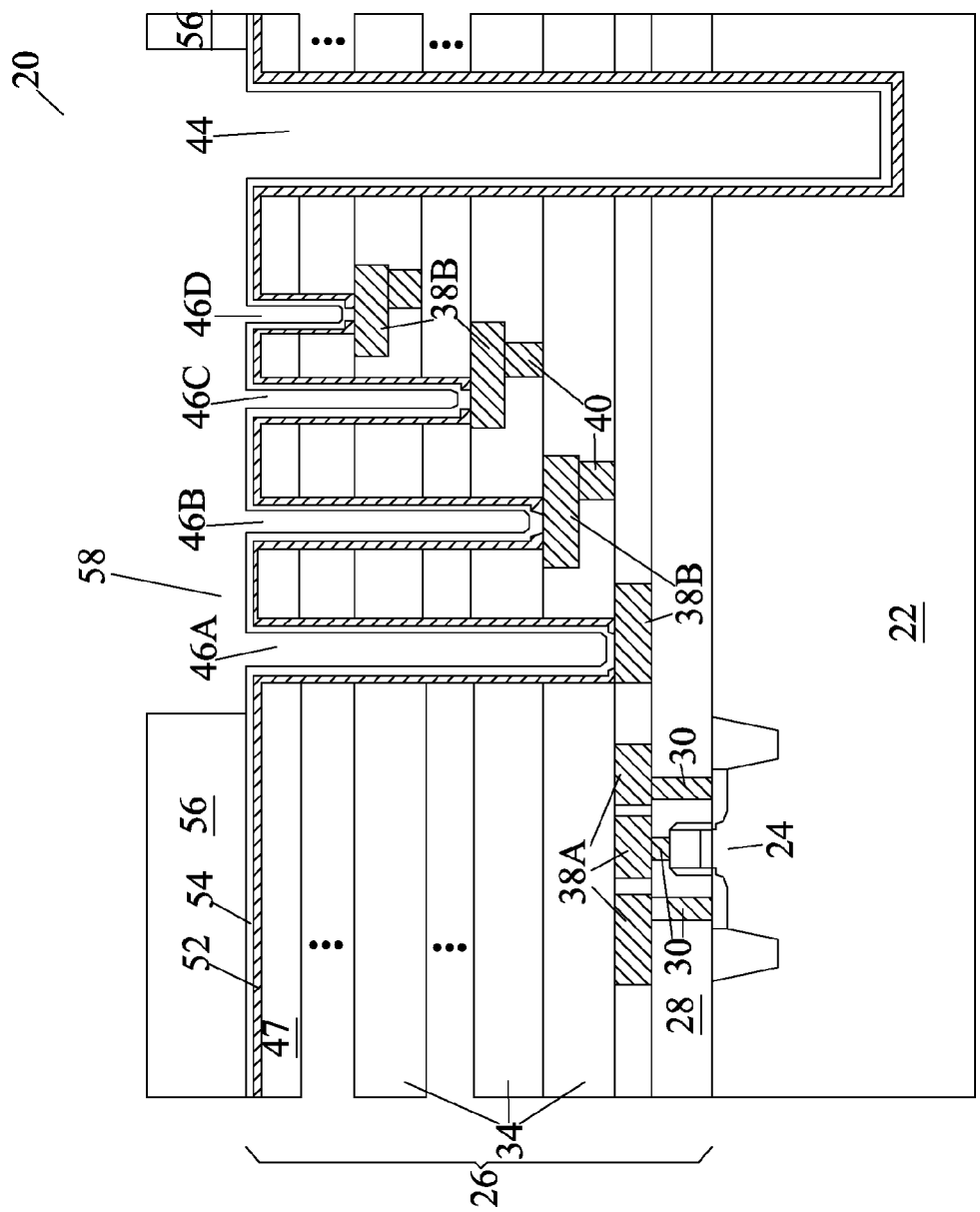

Referring to FIG. 6, mask 56 is formed on the previously formed structure. In an embodiment, mask 56 comprises a photo resist, for example. Mask 56 is then patterned. In an exemplary embodiment, the resulting TSV needs to be connected to metal pads 38B. Accordingly, opening 58 is formed in mask 56, exposing TSV opening 44 and deep via openings 46.

Figure 7:
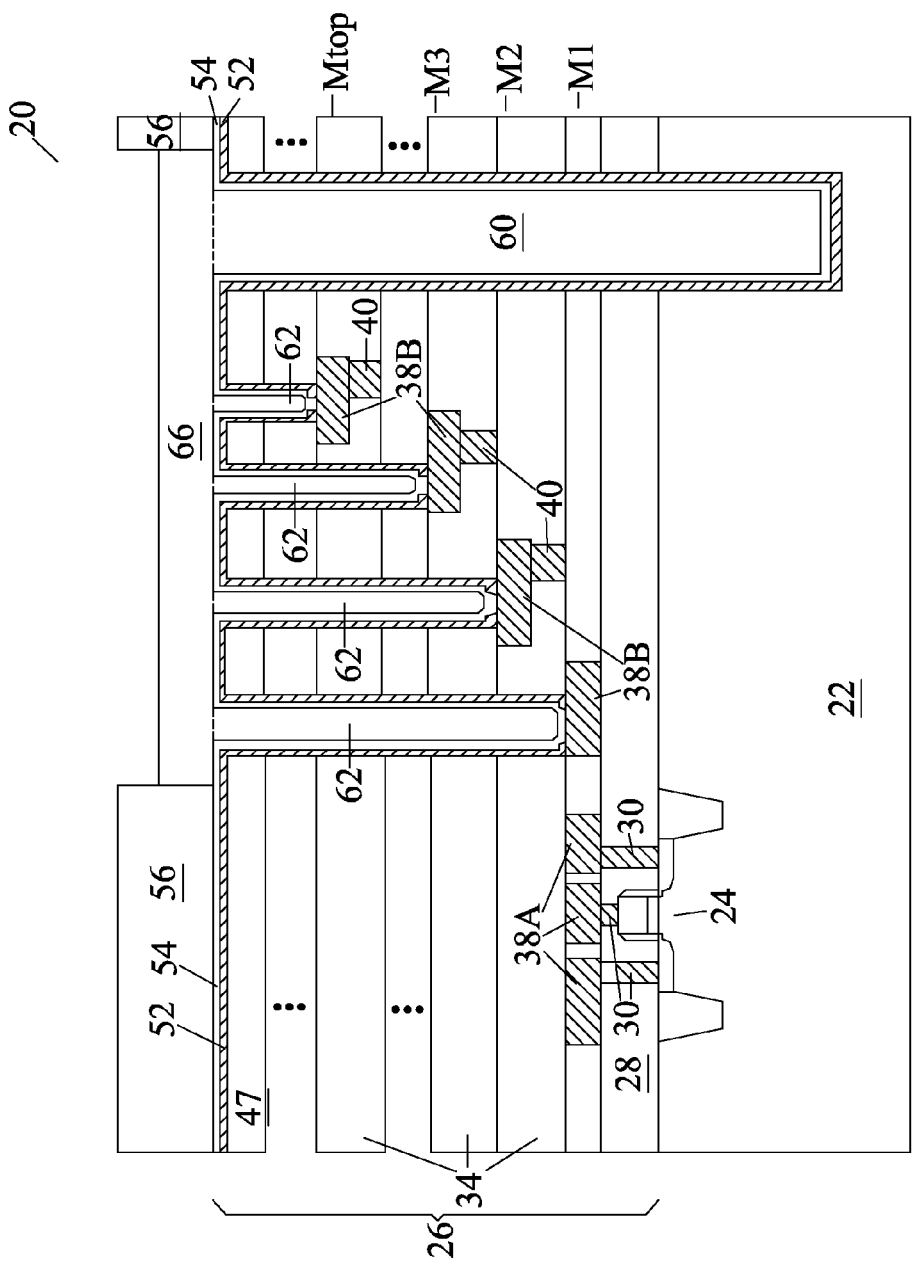

In FIG. 7, a metallic material is filled into openings 44, 46, and 58, forming TSV 60 in TSV opening 44, deep conductive vias 62 in deep via openings 46, and metal line 66 in the opening 58. In various embodiments, the filling material includes copper or copper alloys, although other metals, such as aluminum, silver, gold, and combinations thereof, may also be used. The formation methods may include printing, electro plating, electroless plating, and the like. In the same deposition process in which TSV opening 44 is filled with the metallic material, the same metallic material may also be filled in opening 58, forming metal line 66, which is also referred to a redistribution line.

Figure 8:
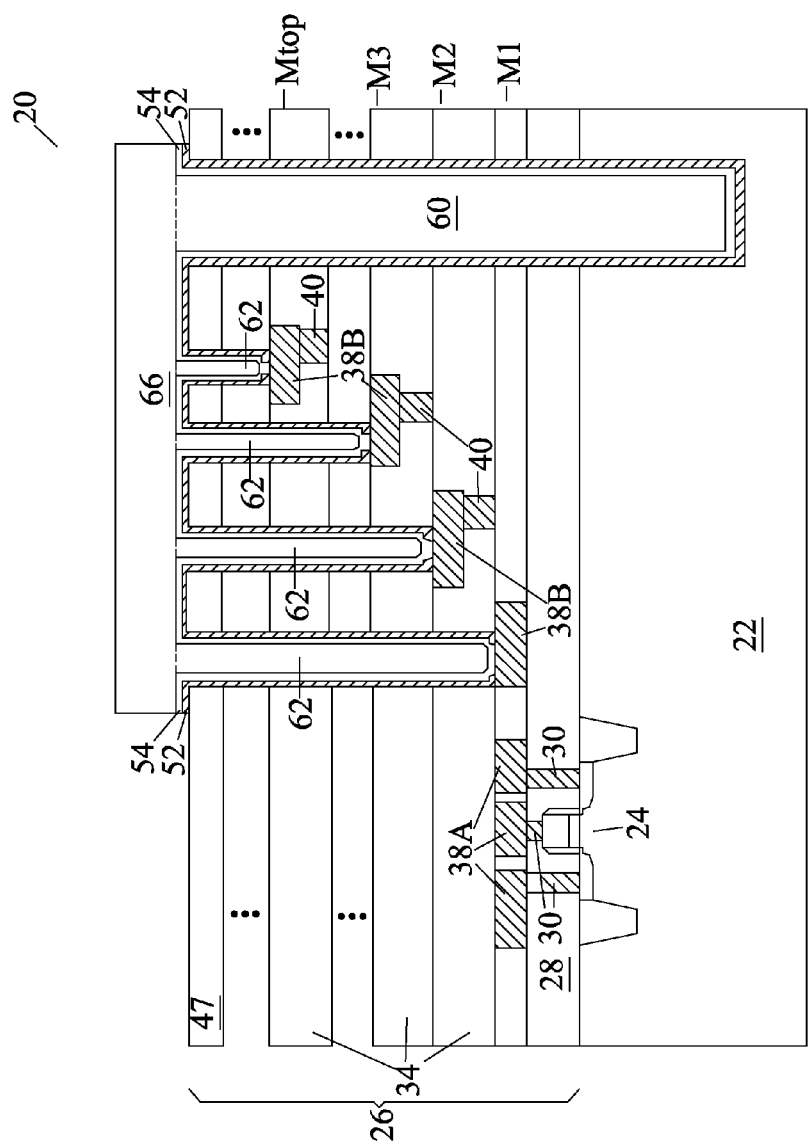
Figure 9:
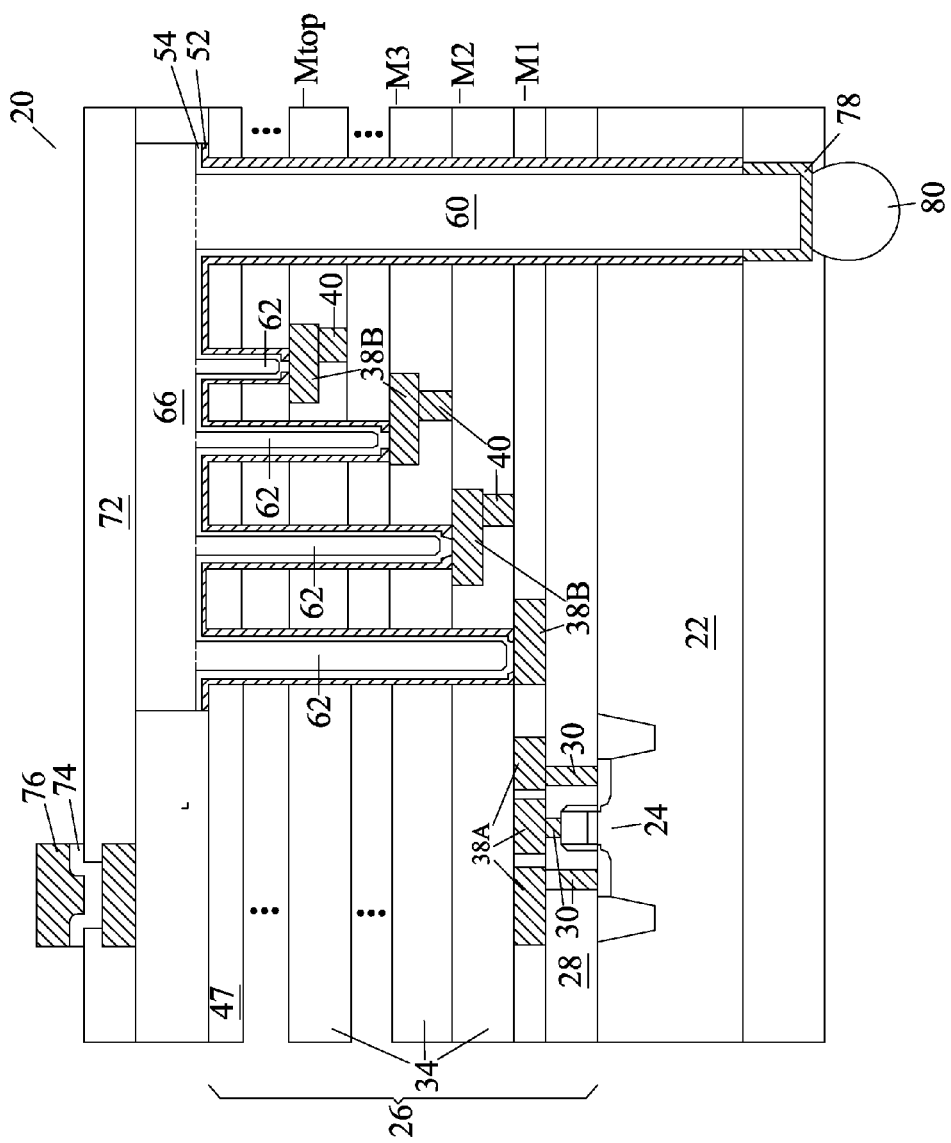

Next, as is shown in FIG. 8, mask 56 is removed. Passivation layer(s) 72 and Under-bump metallurgy (UBM) 74 may then be formed, as shown in FIG. 9. Metal bump 76 is also formed. Metal bump 76 may be a solder bump, a copper bump, and may include other layers/materials such as nickel, gold, solder, and/or the like.

After the formation of Metal bump 76, the backside of wafer 20 may be grinded, so that TSV 60 is exposed. A backside interconnect structure, which may include UBM 78 and bond pad/metal bump 80, is then formed on the backside of wafer 20. Further, a backside interconnect structure (not shown) including a plurality of redistribution layers may be formed between, and electrically coupling, TSV 60 and metal bump 80.

Figure 10:
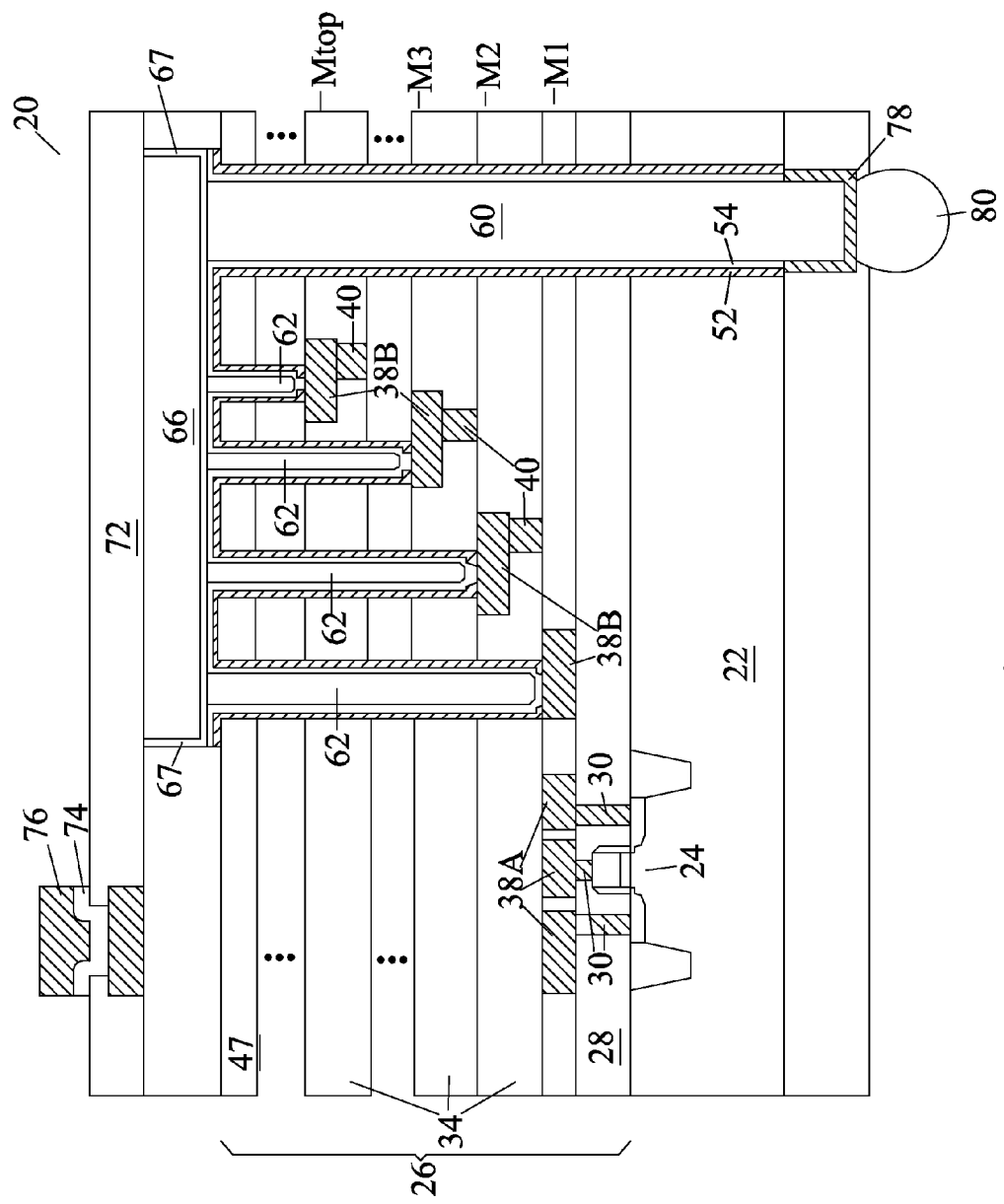
FIG. 10 illustrates a wafer comprising a TSV and deep conductive vias, wherein a metal line connecting the TSV and the deep conductive vias is formed in a process step separated from the process step for forming the TSV and the deep conductive via.

FIG. 10 illustrates an alternative embodiment. This embodiment is essentially the same as the embodiment shown in FIG. 9, except that metal line 66 is not formed in the same process as forming TSV 60 and deep vias 62. In the respect formation process, after the formation of the structure shown in FIG. 5, TSV opening 44 and deep via openings 46 are filled, followed by a planarization process such as a chemical mechanical polish (CMP) to remove excess metal, and hence TSV 60 and deep vias 62 are formed. However, after the CMP, TSV 60 and deep vias 62 are electrically disconnected from each other. Next, metal line 66 is formed to electrically couple TSV 60 to deep vias 62. In the resulting structure, diffusion barrier layer 67 separates TSV 60 and deep vias 62 from metal line 66. Diffusion barrier layer 67 may comprise titanium, titanium nitride, tantalum, tantalum nitride, or the like. In the structure shown in FIG. 9, however, no diffusion barrier layer is formed to separate TSV 60 and deep vias 62 from metal line 66.

Although in the illustrated figures, device dies including semiconductor devices are used as examples, the teaching provided by the embodiments may be readily applied to interposers comprising no integrated circuits such as transistors, resistors, diodes, capacitors, and/or the like. Similarly, by using the embodiments, deep vias can be formed on interconnect structures on either one, or both, of the front-side interconnect structure and backside interconnect structure, with the deep vias connected to TSVs in interposers.

In the embodiments, with the formation of deep vias 62, the power (or signal) introduced to TSV 60 may be provided to metal pads 38B through deep vias 62 that have different lengths. Compared to conventional via-last structures, the paths to metal features that are on different metallization layers are significantly shortened. As a result, the power connection efficiency is improved.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
    a substrate;
    a plurality of dielectric layers over the substrate;
    a plurality of metallization layers formed in the plurality of dielectric layers, wherein at least one of the plurality of metallization layers lower than the top level of the plurality of metallization layers comprises a metal pad;
    an interlayer dielectric (ILD) disposed over the substrate and under the plurality of metallization layers, the bottommost surface of the metal pad above the topmost surface of the ILD;
    a through-substrate via (TSV) extending from the top level of the plurality of the dielectric layers to a bottom surface of the substrate;
    a deep conductive via extending from the top level of the plurality of dielectric layers and landing on the metal pad, wherein the deep conductive via is a structure different from the metal pad;
    a metal line over the top level of the plurality of dielectric layers and interconnecting the TSV and the deep conductive via;
    a passivation layer over the metal line; and
    a metal bump over the passivation layer, the metal bump disposed outside a lateral extent of the metal line.

2. The device of claim 1, wherein the metal pad is positioned in the bottom level of the plurality of metallization layers.

3. The device of claim 1, wherein a first horizontal dimension of the TSV is greater than a second horizontal dimension of the deep conductive via.

4. The device of claim 1 further comprising an integrated circuit device at a surface of the substrate.

5. The device of claim 1, wherein the substrate is substantially free from integrated circuit devices.

6. The device of claim 1, wherein the TSV and the metal line form a continuous region formed of a same metallic material, with no barrier layer between the TSV and the metal line.

7. The device of claim 1 further comprising a barrier layer between the TSV and the metal line.

8. A device comprising:
    a substrate;
    an interconnect structure over the substrate, the interconnect structure comprising:
        a plurality of metallization layers comprising:
            a bottom metallization layer (M1);
            a first metallization layer (M2) immediately over the M1;
            a second metallization layer (M3) immediately over the M2;
            a top metallization layer (Mtop) over the M3; and
        at least one metal pad formed in each of the M1, M2, and M3;
    a through-substrate via (TSV) extending from the Mtop to a bottom surface of the substrate;
    a plurality of deep conductive vias each extending from a top surface of the Mtop through at least a bottom surface of the Mtop to a respective one of the metal pads, wherein the deep conductive via is a structure different from a structure of the metal pad;
    a metal line overlying the interconnect structure and interconnecting the TSV and the deep conductive via; and
    a passivation layer overlying the metal line, wherein no portion of a surface of the metal line facing away from the substrate is free from the passivation layer.

9. The device of claim 8, wherein the substrate is a silicon substrate.

10. The device of claim 8, wherein the substrate is a dielectric substrate.

11. The device of claim 8, wherein the TSV and the metal line are formed of a same metallic material, with no diffusion barrier layer between the TSV and the metal line.

12. The device of claim 8 further comprising a diffusion barrier layer between the TSV and the metal line.

13. The device of claim 8, wherein a ratio of a first horizontal dimension of the TSV to a second horizontal dimension of the deep conductive via is greater than about 1.2.

14. A device comprising:
    a substrate;
    a plurality of dielectric layers over the substrate;
    a plurality of metallization layers formed in the plurality of dielectric layers, wherein at least one of the plurality of metallization layers lower than the top level of the plurality of metallization layers and higher than the bottom level of the plurality of metallization layers comprises a metal pad;
    a deep conductive via extending from the top level of the plurality of dielectric layers and landing on the metal pad, wherein the deep conductive is a structure different from the structure of the metal pad, and wherein a width of the deep conductive via is smaller than a width of the metal pad;
    a metal line over the top level of the plurality of dielectric layers and configured to interconnect the deep conductive via to a through-substrate via TSV; and
    a passivation layer fully covering the metal line.

15. The device of claim 14, a barrier layer between the deep conductive via and the metal line.

16. The device of claim 14, further comprising a through-substrate via (TSV) extending from the top level of the plurality of the dielectric layers to a bottom surface of the substrate.

17. The device of claim 16, a barrier layer between the TSV and the metal line.

18. The device of claim 1, wherein the metal pad has a width greater than a width of the deep conductive via.

* * * * *